US010963150B2

(12) United States Patent
Korsky et al.

(10) Patent No.: US 10,963,150 B2
(45) Date of Patent: *Mar. 30, 2021

(54) SYSTEM FOR DESIGNING AND CONFIGURING A HOME IMPROVEMENT INSTALLATION

(71) Applicant: Bath Authority LLC, Warminster, PA (US)

(72) Inventors: Michael Korsky, Newtown, PA (US); Marina Seredova, Warminster, PA (US)

(73) Assignee: BATH AUTHORITY LLC, Warminster, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/898,722

(22) Filed: Jun. 11, 2020

(65) Prior Publication Data

US 2020/0301572 A1 Sep. 24, 2020

Related U.S. Application Data

(63) Continuation of application No. 15/874,605, filed on Jan. 18, 2018, now Pat. No. 10,698,592.

(Continued)

(51) Int. Cl.
*G06F 3/0484* (2013.01)
*G06F 3/0482* (2013.01)

(Continued)

(52) U.S. Cl.
CPC ........ *G06F 3/04847* (2013.01); *G06F 3/0482* (2013.01); *G06F 30/13* (2020.01);

(Continued)

(58) Field of Classification Search
None
See application file for complete search history.

(56) References Cited

U.S. PATENT DOCUMENTS 5,367,627 A 11/1994 Johnson
5,493,490 A 2/1996 Johnson (Continued)

OTHER PUBLICATIONS

Grohe, Shower Configurator, obtained at <https://www.grohe.com/na/31572/shower/shower-configurator/> , printed on Nov. 9, 2016.

(Continued)

*Primary Examiner* — Ariel Mercado
(74) *Attorney, Agent, or Firm* — Fox Rothschild LLP

(57) ABSTRACT

A home improvement installation configuration system causes a device to output a user interface having a sector with a graphic representation of the installation and a sector with user-selectable input fields for dimensions of the installation. The system accesses a data store of design models and facets. When the user interface receives an installation design type and a number of facets of the installation, the system will extract a design model from the data store so that the extracted model corresponds to the design type and the number of facets. The user interface will output the graphic representation, receive dimension values, and augment the graphic representation with indicia of the dimension values. It will also identify facet(s) that are operable with the extracted model and that have measurements which correspond to the received dimensions. The system will cause the user interface to display each identified facet for selection.

20 Claims, 5 Drawing Sheets

201
202
Rebate Center | Order Tracker | Weekly Ad | Gift Registry | Welcome, Sign In | Cart (0)
Shower Configurator
HELP SHARE PRINT
1 CONFIGURATION
2 DOOR TYPE
3 DIMENSIONS
4 DOOR STYLE
5 OPTIONS
6 MATCHING PRODUCTS
DOES YOUR SHOWER SPACE HAVE TWO OR THREE WALLS?
203
Two walls (Corner)
Three Walls (Alcove)

Related U.S. Application Data

(60) Provisional application No. 62/448,189, filed on Jan. 19, 2017.

(51) Int. Cl.
*G06T 11/60* (2006.01)
*G06T 19/00* (2011.01)
*G06F 30/13* (2020.01)

(52) U.S. Cl.
CPC .............. *G06T 11/60* (2013.01); *G06T 19/00* (2013.01); *G06T 2200/24* (2013.01); *G06T 2210/04* (2013.01)

(56) References Cited

U.S. PATENT DOCUMENTS

| | | | | |
|---|---|---|---|---|
| 6,141,105 | A * | 10/2000 | Yahashi | G01B 11/005 356/623 |
| 6,453,302 | B1 | 9/2002 | Johnson et al. | |
| 7,233,885 | B1 * | 6/2007 | Larabee | G06F 30/00 703/1 |
| 7,574,653 | B2 * | 8/2009 | Croney | G06T 3/4092 345/428 |
| 7,627,503 | B1 | 12/2009 | Champagne et al. | |
| 8,578,262 | B2 | 11/2013 | Averitt et al. | |
| 10,346,892 | B1 * | 7/2019 | Bagchi | G06Q 30/0621 |
| 10,663,294 | B2 * | 5/2020 | Pershing | G01B 21/28 |
| 2001/0044749 | A1 | 11/2001 | Heisler et al. | |
| 2005/0081161 | A1 | 4/2005 | MacInnes et al. | |
| 2005/0091008 | A1 | 4/2005 | Green et al. | |
| 2009/0144175 | A1 * | 6/2009 | Penaflor | G06Q 10/043 705/26.1 |
| 2009/0160856 | A1 * | 6/2009 | Hoguet | G06T 17/00 345/420 |
| 2014/0132633 | A1 | 5/2014 | Fekete et al. | |
| 2016/0196689 | A1 | 7/2016 | Pullan | |
| 2017/0161404 | A1 * | 6/2017 | High | G06F 30/13 |
| 2017/0169340 | A1 * | 6/2017 | Asente | G06F 30/00 |

OTHER PUBLICATIONS

Home Depot: Delta Shower Doors, obtained at <http://homedepot.showerdoorinstallation.com/desktop/> , printed Nov. 26, 2016.

Vismaravetro, Shower Enclosure Configurator, obtained at <http://www.vismaravetro.it/en/configurator.html> , printed on Oct. 15, 2016.

Infonnation about Related Patents and Patent Applications, see section 6 of the accompanying Information Disclosure Statement Letter, which concerns Related Patents and Patent Applications.

U.S. Appl. No. 15/874,605, filed Jan. 18, 2018, System for Designing and Configuring a Home Improvement Installation.

* cited by examiner

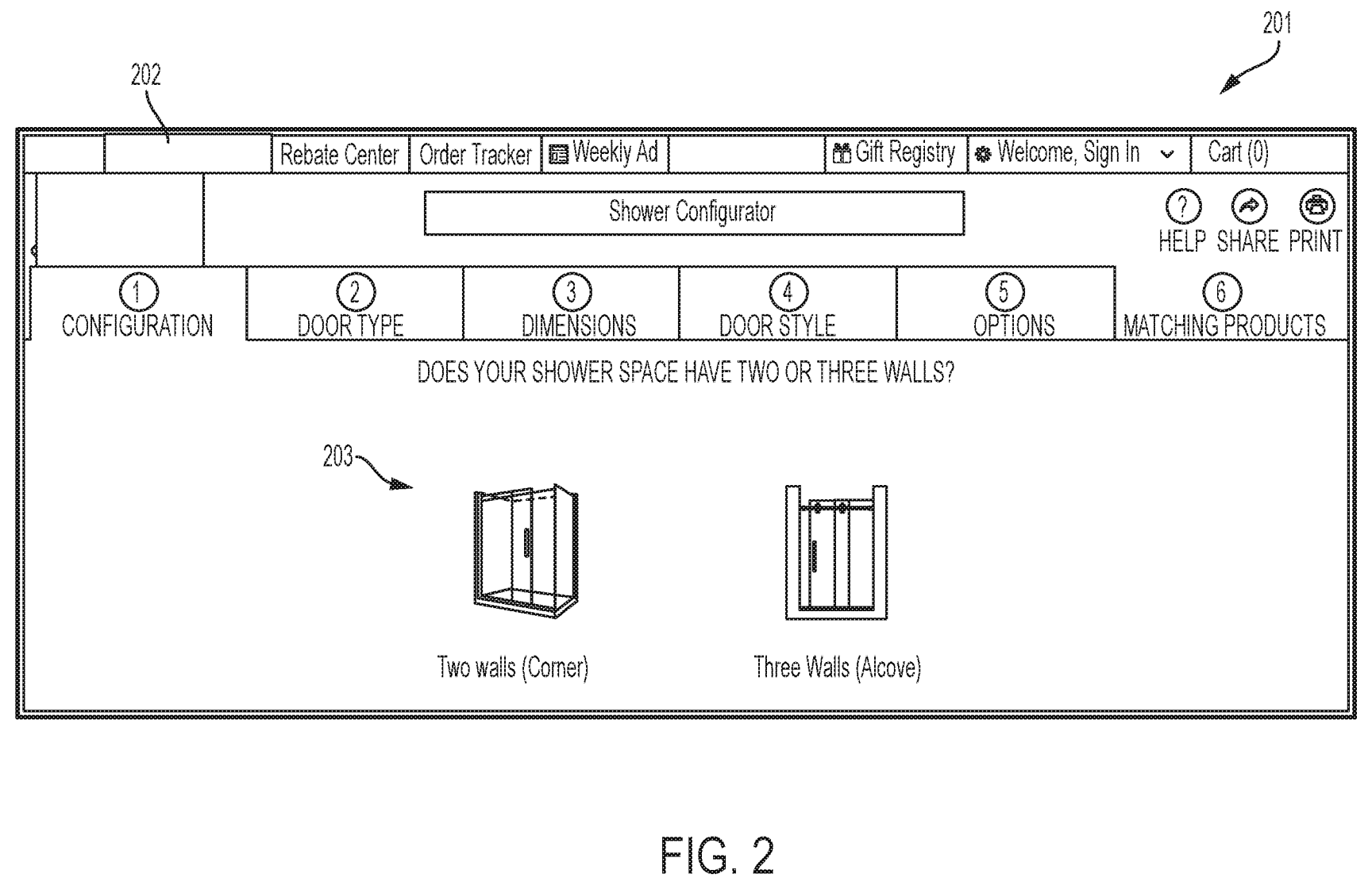

201

202

Rebate Center | Order Tracker | Weekly Ad | Gift Registry | Welcome, Sign In | Cart (0)

HELP SHARE PRINT

Shower Configurator

1 CONFIGURATION

2 DOOR TYPE

3 DIMENSIONS

4 DOOR STYLE

5 OPTIONS

6 MATCHING PRODUCTS

DOES YOUR SHOWER SPACE HAVE TWO OR THREE WALLS?

203

Two walls (Corner)

Three Walls (Alcove)

FIG. 2

SYSTEM FOR DESIGNING AND CONFIGURING A HOME IMPROVEMENT INSTALLATION

RELATED APPLICATIONS AND CLAIM OF PRIORITY

This patent document claims priority to, and is a continuation of, U.S. patent application Ser. No. 15/874,605 filed Jan. 18, 2018, now U.S. Pat. No. 10,698,592, which in turn claims priority to U.S. provisional patent application No. 62/448,189 filed Jan. 19, 2017. The disclosures of each priority application are fully incorporated into this document by reference.

BACKGROUND

Computer-aided design (CAD) systems are available for a variety of applications. CAD applications can include those that help consumers custom-design or custom-specify certain products. For example: home improvement retailers may provide online systems that can help a customer estimate the sizes of various components required for a home improvement project; automobile manufacturers may provide vehicle configuration tools that help a customer select various options of a desired vehicle; and furniture configuration software exists in which consumers can place icons corresponding to furniture in a room space to see how various items of furniture will fit and lay out in a room.

A problem with existing product configuration systems is that they do not fully provide users with CAD functionality. Instead, they are limited to enabling a user to select from various specific configurations and/or features that are available in an inventory, and thus do not facilitate truly custom design. In addition, existing product configuration systems are stand-alone systems that require either: (a) the retailer to implement significant technical integration and website modifications to offer the configurator to users in a seamless user experience; or (b) the user to exit the retailer's website or other software application and access an entirely different system to use the configuration system.

This document describes methods and systems that address technical issues including but not limited to those described above.

SUMMARY

In an embodiment, a system for automatically configuring and designing a home improvement installation includes a processing device and a computer-readable storage medium containing programming instructions that are configured to cause a user electronic device to output a user interface. The user interface will have a first sector for displaying a graphic representation of a home improvement installation. The user interface will also have one or more second sectors for displaying a set of user-selectable input fields by which the system is configured to receive user-input values for dimensions of the home improvement installation. The system will access a data store of dimension data for various design models and facets for the home improvement installation. Each of the facets will have associated measurements.

The processor will implement a home improvement project configuration process by receiving, via the user input device, an installation design type and a number of facets of the installation. The processor will extract, from the data store, at least one design model that corresponds to the installation design type and the number of facets. The processor will cause the first sector of the display device to output the graphic representation of the extracted design model. The processor will cause the second sector of the display device to output the plurality of user-selectable input fields. The processor will receive dimension values comprising at least a height and a width for the installation. The processor will cause the first sector of the display device to augment the graphic representation of the extracted design model with indicia of the received dimension values. The processor will identify, from the data store, at least one facet that is operable with the extracted design model and that has associated measurements which correspond to the received dimension values. The processor will cause the display device to display an image of each identified facet for further selection by a user via the user electronic device.

Optionally, when implementing the home improvement project configuration process, the processor may receive, via the user input device, one or more other attributes of the installation. If so, it may eliminate any facet that does not have the one or more received attributes from the identified facets. The processor will then cause the display device to display only those identified facets that have the one or more received attributes.

Optionally, before causing the display device to display each identified facet, the processor may determine whether a number of facets identified in the identifying step exceeds a threshold. If the number of facets exceeds the threshold, then the processor may cause the display device to output at least one user-selectable additional prompt that solicits information relating to a characteristic of a facet. The processor may receive one or more characteristics via the user electronic device in response to the prompt. The processor may eliminate any facet that does not have the one or more received characteristics from the identified facets. The processor may then cause the display device to display only those identified facets that have the one or more received characteristics.

Optionally, the processing device may receive a user selection of one of the facets that are displayed on the display device. It also may receive a user-provided digital image of the room in which the installation will occur. If so, the processor may then augment the user-provided digital image to insert an image of the user-selected facet in the room. The processor may then cause the display device to display the augmented digital image.

Optionally, the processor may receive, via the user electronic device, an indication that a facet of the installation is not straight. If so, then the system may determine that a width associated with that facet is a null value.

Optionally, if no facet in the data store is operable with the extracted design model and has associated measurements that match to the received dimension values, then the processor may identify an alternative facet that is operable with the extracted design model and that has associated measurements that are smaller than at least some of the received dimension values. The processor also may identify a custom panel that, when attached to the identified alternative facet, will result in a composite facet having associated measurements that match the received dimension values. Then, when causing the display device to display the image of each identified facet, the system may cause the display device to display the composite facet.

The system also may determine a value and a delivery time estimate for the composite facet, determine a value and a delivery time estimate for a fully-custom facet that is operable with the extracted design model and that will have associated measurements that match the received dimension values, and cause the display device to display the determined values and delivery time estimates for each of the composite facet and the fully-custom facet.

Optionally, the programming instructions that are configured to cause the user electronic device to output the user interface may include instructions to do so in response to a call from a script that is running on the device when an application of the device accesses a product distributor application that includes the script.

Optionally, the system may include an optical distance measuring device configured to measure dimensional data of one or more surfaces. The programming instructions that are configured to cause the processing device to implement the home improvement installation configuration process also may include instructions to receive the dimension values from the optical distance measuring device.

Optionally, the processing device may receive a user or device selection of one of the facets that are displayed on the display device, identify a device or application type for the display device, and access a data store and identify an image delivery format that corresponds to the device or application type. Then, when causing the display device to display an image of each identified facet, the system may cause the image to be displayed in the identified image delivery format.

BRIEF DESCRIPTION OF THE DRAWINGS

FIG. 2 illustrates an example user interface with a product distributor site in a first sector and a product configuration engine in a second sector.

DETAILED DESCRIPTION

Terminology that is relevant to this disclosure includes:

An "electronic device" or a "computing device" refers to a device that includes a processor and memory. Each device may have its own processor and/or memory, or the processor and/or memory may be shared with other devices as in a virtual machine or container arrangement. The memory will contain or receive programming instructions that, when executed by the processor, cause the electronic device to perform one or more operations according to the programming instructions. Examples of electronic devices include personal computers, servers, mainframes, virtual machines, containers, gaming systems, televisions, and mobile electronic devices such as smartphones, personal digital assistants, cameras, tablet computers, laptop computers, media players and the like. In a client-server arrangement, the client device and the server are electronic devices, in which the server implements instructions and/or data to provide a service that the client device accesses via one or more communications links in one or more communications networks. In a virtual machine arrangement, a server may be an electronic device, and each virtual machine or container may also be considered to be an electronic device. In the discussion below, a client device, server device, virtual machine or container may be referred to simply as a "device" for brevity.

In this document, the singular forms "a," "an," and "the" include plural references unless the context clearly dictates otherwise.

In this document, the term "comprising" means "including, but not limited to."

Unless defined otherwise, all technical and scientific terms used in this document have the same meanings as commonly understood by one of ordinary skill in the art.

Figure 1:
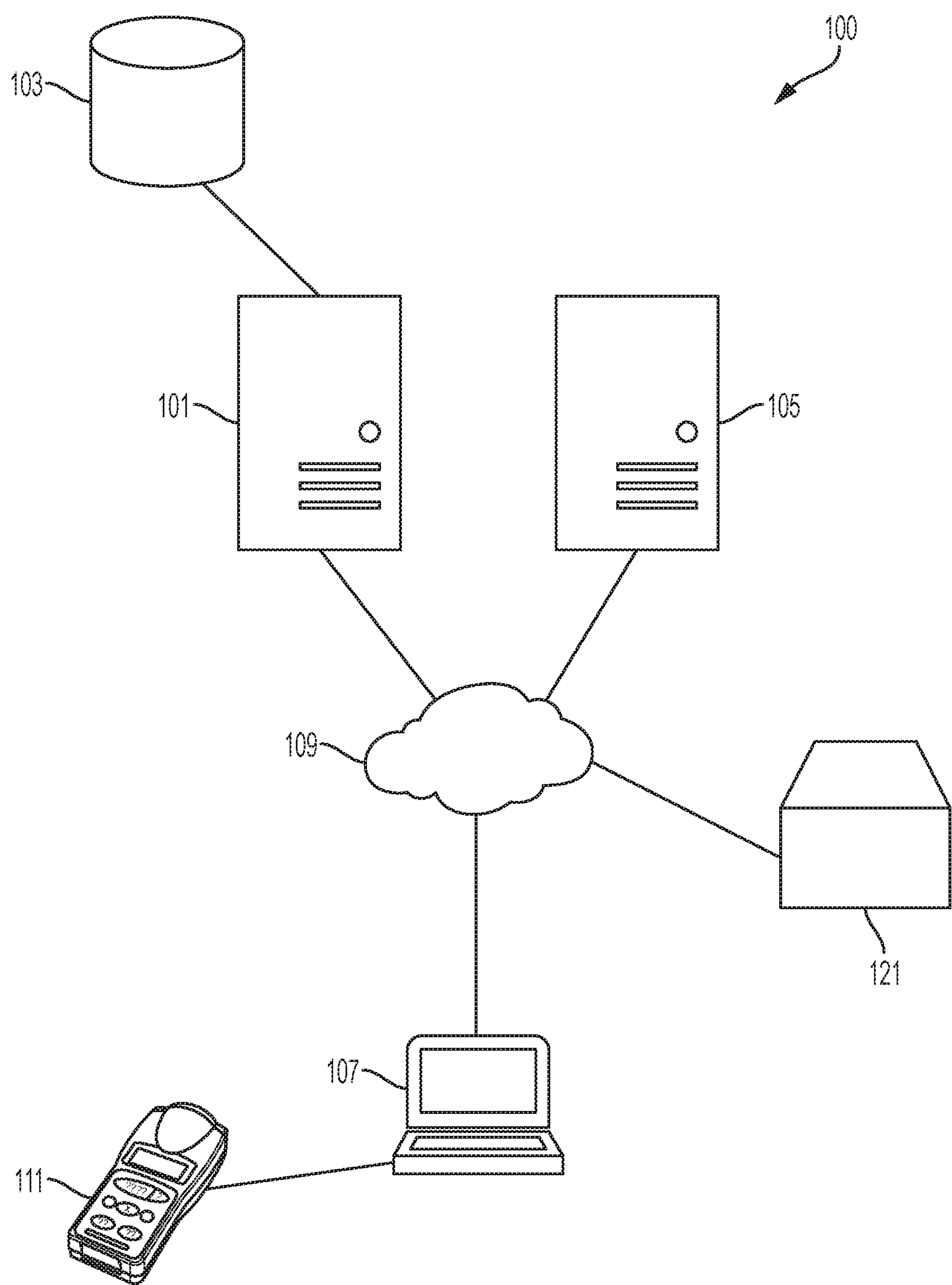
FIG. 1 illustrates an example computer-aided product configuration system.

FIG. 1 illustrates various elements of a product configuration system 100. The system includes a product configuration server 101 that is communicatively connected to a data store 103 of product model information, such as dimension data and other product design specifications. The server 101 communicates with any number of client electronic devices 107 via one or more communications networks 109. The product configuration server 101 provides a product configuration application that the client electronic devices 107 can access via one or more locally-installed applications, such as a browser, a software application of a retail store that sells products that are included in the product configuration server's data store 103, a virtual reality application or another type of mobile application.

A product distributor server 105 also communicates with the client computing devices 107 via the communications network(s) 109. The product distributor server 105 provides a website and/or data for one or more client-installed applications by which a user of a client electronic device may view, select and order products that are available from the product distributor. For example, product distributor server 105 may serve a website of a retail store, data for a retailer's mobile app, a website of a contractor, or a website or app data of a product manufacturer who makes products available directly to consumers. In various embodiments, the product distributor server 105 also may communicate with the product configuration server 101 via the communications network(s) 109. In other embodiments, the product distributor server 105 and product configuration server 101 may operate without communicating with each other.

The product distributor server 105 causes the locally-installed application of the client device 107 to output a web page or other user interface by which a user may view, select, and/or order products from the product distributor who is associated with the server 105. The locally-installed webpage or user interface may include a script, authentication mechanism or other technical feature that calls or points to an address of the product configuration server 101 so that the product configuration server 101 serves the product configuration application to the client device 107 via a window or pop-up within the webpage or product configuration application. An example of this is illustrated in FIG. 2, in which the user interface 201 is a web page, as displayed by a browser application, with a drop-down or otherwise functional menu 202 via which the user may access functions of the distributor such as an ordering function, an account management function, and/or functions that provide information such as access to a weekly print advertisement. The programming code for the user interface 201 will designate a sector to serve as a window to display a product configuration engine 203 as served by the product configuration server. The programming code also will include a script or other function that causes the window to point to an address of the product configuration server and present the product configuration engine 203 within the window of the user interface. As shown in FIG. 2, this presentation may be seamless to the user in that the user interface does not display any indication that the distributor's functional menu 202 and the product configuration engine 203 are served by distinct servers.

The product configuration engine 203 may initially output a number of questions or user-selectable options for which the user must respond. The number of questions will depend on the any of various parameters, such as complexity of the desired home improvement installation or other desired specifications. By way of example in FIG. 2, the system asks how many facets (shower walls) the installation will include. The product configuration server may provide a set of questions in a tree-based rule set to provide the shortest path to the product selection. Example: a first scenario may require seven user interactions to get to the optimal product, while a second scenario (with different user responses to the initial questions) may would allow the user to get to the product selection in three steps.

Figure 3:
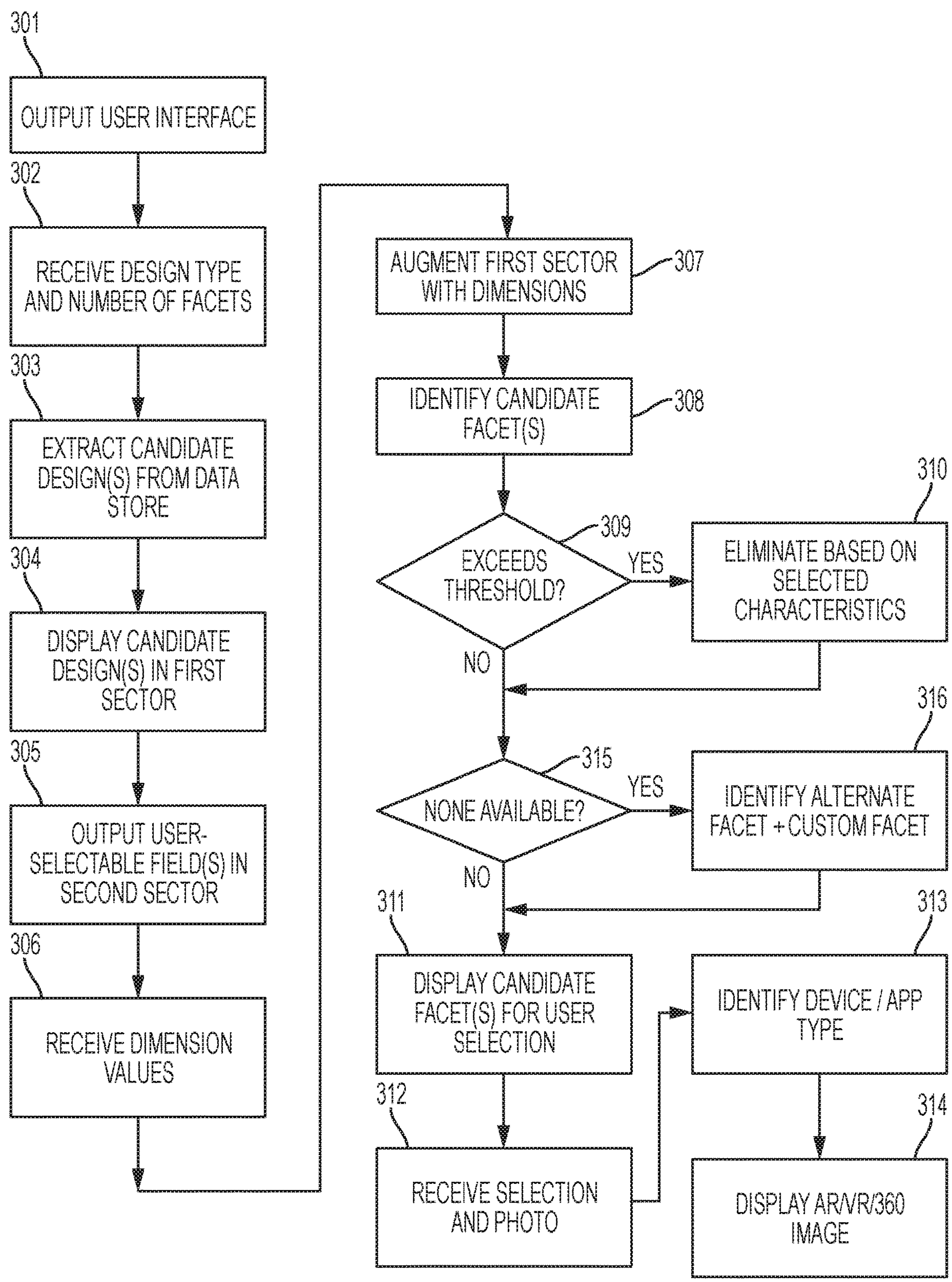
FIG. 3 illustrates a process by which a product configuration engine may operate.

FIG. 3 illustrates a process by which the product configuration engine may operate. In this example and various figures, to facilitate understanding of the invention, this disclosure will describe a shower configuration such as may be used in a residential, hotel, or commercial bathroom shower installation. However, the invention is not limited to shower installation embodiments. Rather, it is intended that the methods and systems of this disclosure can be used to design other residential and commercial construction installations (such as kitchens and/or other elements of a bathroom such as vanities) and other situations in which a custom designed product may be ordered online. Thus, the term "product" (or any particular category of product such as those listed above) may be substituted for the term "shower" in various embodiments.

Figure 4:
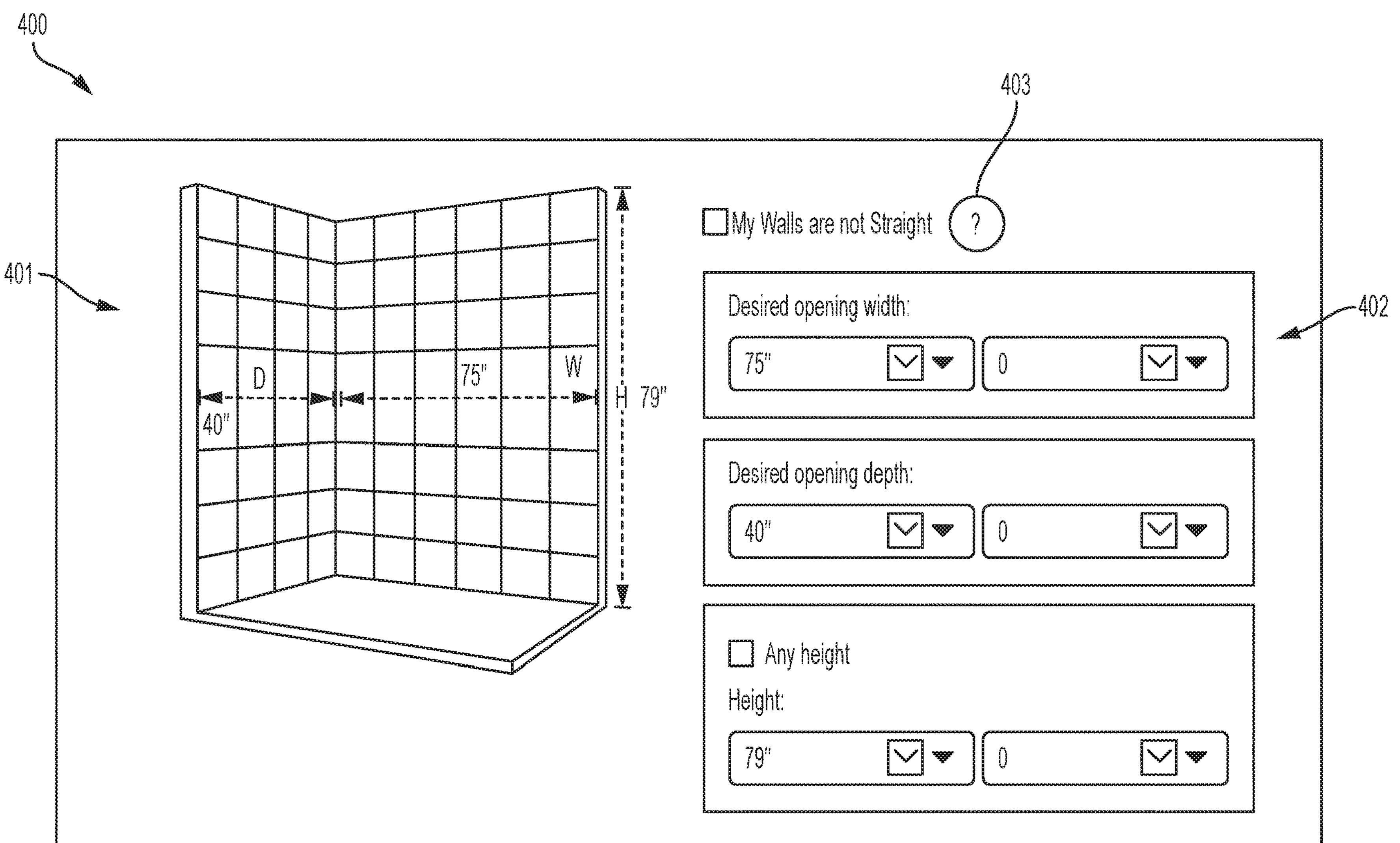
FIG. 4 illustrates an additional example page of a user interface of a product configuration system.

Referring to FIG. 3, a user interface of an electronic device displays a user interface (step 301) that includes a first sector for displaying a graphic representation of a shower installation, and one or more second sectors for displaying a set of user-selectable input fields by which the system is configured to receive user-input values for dimensions for the shower installation. An example of such a user interface is shown in FIG. 4, in which the user interface 400 includes a first sector 401 that displays a graphic representation of a shower installation, and a second sector 402 with selectable input fields by which the system is configured to receive user-input values for dimensions of the shower installation. The user interface may be served by a product configuration engine, as described above in the context of FIGS. 1 and 2. The product configuration engine may include or have access to a data store of dimension data for various shower design models and shower doors that are available in an inventory. Each shower door may have associated measurements, such as height and width measurements, stored in the data store.

Returning to FIG. 3, the user will use the user interface to enter, and the system will thus receive, via the user input device, a shower design type and a number of facets of the shower (such as walls) (step 302). The product configuration engine will then access the data store to identify and extract least one candidate shower design model that corresponds to the shower design type and the number of facets (step 303). The system may identify the candidate design models as those having an associated design type and number of facets that match the received values of those characteristics.

The system will then cause the first sector of the user interface to output the graphic representation of the extracted shower design model (step 304), and it will cause the second sector of the display device to output user-selectable input fields by which a user may enter dimension values for the facets and/or other desired characteristics (step 305). In some embodiments, the dimension values may be a predetermined set of dimension values that correspond to dimensions of shower models that are in an inventory of a product distributor. In other embodiments, the user may be able to select any number of dimensions (optionally within an upper and/or lower range) so that the user can select a custom design that the product distributor will manufacture to fit regardless for whether the dimension is a standard design. In some embodiments, the system may allow the user to select either standard or custom dimensions, and it may output an indicator that informs the user of which dimensions are standard and/or custom. In some embodiments, the system may include an electronic distance measurement instrument (see 111 in FIG. 1), such as a laser-based distance measurement device that receives and enters the distance measurements into the system.

Once the system receives dimension values that include at least a height and a width for one or more facets of the shower installation (step 306), the system will cause the first sector of the display device to augment the graphic representation of the extracted shower design model with indicia of the received dimension values on the corresponding facet(s) (step 307). An example of this is shown in FIG. 4, in which the system has received height, width and depth values in the second sector 402, and it has augmented the corresponding facets of the shower shown in the first sector 401 so that the dimension values are displayed with the shower model. In some embodiments, the product configuration engine also may permit the user to enter one or more other attributes of the installation, such as color, edge type (frameless/semi-frameless/framed/etc.), or other features. If so, then when displaying the shower model, the graphic representation may display these attributes. Optionally, the system may include an interface element that allows the user to change one or more of the installation's attributes (e.g., color, edge type, dimensions etc.) and it may change the graphic representation according to the selected attributes.

Figure 5:
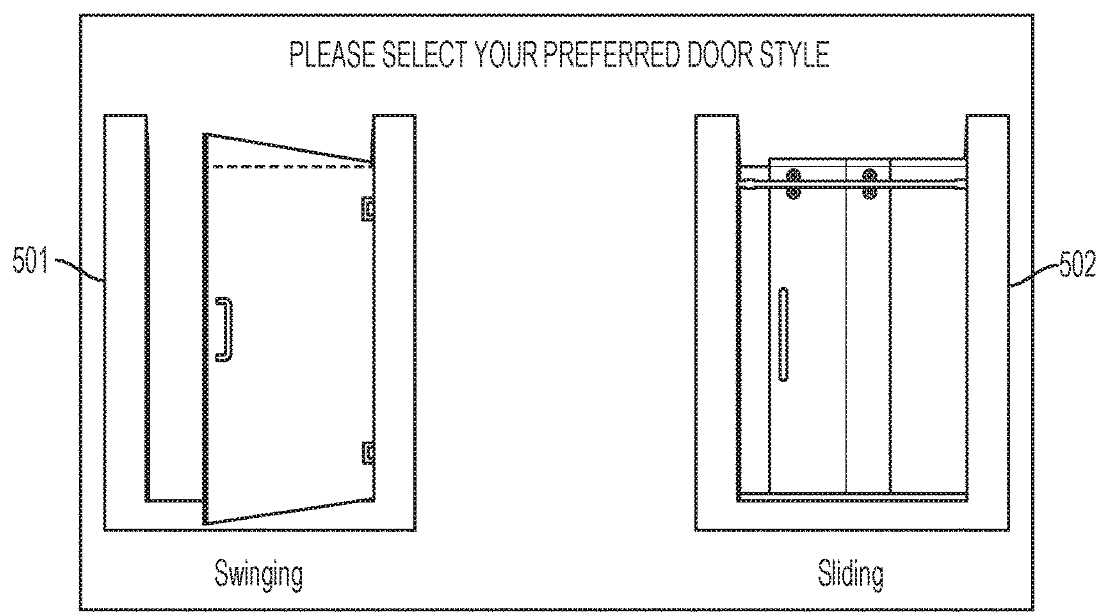
FIG. 5 illustrates an additional example page of a user interface of a product configuration system.

Returning to FIG. 3, the system will then access the data store and attempt to identify at least one facet type (e.g., a shower door type) that is operable with the extracted design model and that has associated measurements which correspond to the received dimension values (step 308). The system will then cause the display device to display an image of each identified facet (e.g., each shower door) for further selection by a user via the user input device (step 311). An example of this is shown in FIG. 5, in which the system has identified that either swinging 501 or sliding 502 doors are operable with the shower design model, so it displays those options (or other product attributes) in a user-selectable format, such as with a link to another page of the system via which the user may add the selected option to the design.

Returning to FIG. 3, optionally, before displaying the identified facet types, the system may first determine whether the number of candidate facet types exceeds a threshold (step 309). If so, then it may cause the user interface to output one or more user-selectable prompts that enable the user to provide additional information about characteristics of the facet that the user desires. The system may then eliminate from the candidate set any candidate facet that does not satisfy the requested characteristics (step 310).

There may be situations in which the system attempts to identify at least one facet type that is operable with the extracted design model and that has the received dimension values, but it finds that no such facet exists in the data store (step 315). If no facet listed in the data store that is both operable with the extracted design model and has measurements that match the received dimension values, then the system may identify an alternative facet that is operable with the extracted design model and that has associated measurements that are smaller than at least some of the received dimension values (step 316). The system would also then access the data set and identify a custom panel that, when combined with other elements of off-the shelf products, will result in a composite facet having associated measurements that match the received dimension values (also step 316). For example, as an alternative to finding an alternative facet that is smaller than the received dimension values, the system may identify an alternative facet that has one or more dimensions that are larger than the received dimension values, and a second facet that is smaller than an anticipated fact so that the overall installation (such as a shower door fact and fixed panel facet) matches the received dimension values. Then, when causing the display device to display the image of each candidate facet (e.g., each candidate shower door) (step 311), the system will cause the display device to display the composite shower door or other facet with the alternative standard panel and the selected custom panel. Optionally, the system may obtain images of the facets from the data store, or if no image is available for a particular facet it may render an image of that facet based on the received dimension data and a rule set that specifies what features the rendered image may have.

When no such combination is found the system may build a custom solution. The system may do this by rendering a facet having the received dimension values based on the received dimension data and a rule set that specifies what features the rendered image may have. Optionally, the system also may superimpose one or more existing images onto the rendered images in locations where the rule set specifies it to do so (e.g., place an image of a handle on a first side of a door at a height that is three feet up from the bottom of the door). Also, for ordering purposes, in some embodiments the system may select the next largest item that is available (as compared to the custom item) and specify that item so that it may be ordered and customized.

If the user selects a candidate facet that is a composite facet, the system may access the data set. Based on data in the data set for the components of the composite facet, the system determines a cost value and a delivery time estimate for the composite item. This system may do this by receiving the data directly from the data set, or it may retrieve algorithms for calculating such values from the data set and it may apply variables relating to the composite item to the algorithm, or it may retrieve an algorithm from memory and use apply variables that are parameters of the composite item and/or that are found in the data set. The system may also determine a cost value and a delivery time estimate for a fully-custom facet (i.e., one that is not made a composite facet made of available components) that is operable with the extracted design model and that will have associated measurements that match the received dimension values. When determining the cost values and delivery time estimates, the system also may consider additional data such as customer reviews and/or ratings, style attributes, etc. It may then cause the user interface to display the determined values and delivery time estimates for each of the composite facet and the fully-custom facet so that the user can choose and select either the composite item (typically at a relatively lower cost and delivery time) or a fully-custom item (typically at a relatively higher cost and delivery time).

In some embodiments, when a user selects one of the candidate facets that are displayed on the user interface, the system receives the selection and it may receive a user-provided digital image (which may include one or more images and/or videos) of the room in which the installation will occur (step 312), optionally after prompting a user to capture or upload the digital image of the room. The system may then augment the user-provided digital image to insert an image of the user-selected facet (e.g., shower door) or other parts of the installation in the room and it may cause the display device to display the augmented digital image (step 314). The system may do this using any now or hereafter known image augmentation process, such as one that obtains a pre-rendered image and scales it to match a scale of the installation, and that then overlays pixels of the product installation on a background, while leaving certain pixels of the overlay (such as those corresponding to glass) as the background color. Other augmented reality (AR) computing platforms that may be used include that currently known as Tango at the priority date of this application, as well as future updates to that system. If the system needs to render a custom installation, it may do so based on the product configuration. For example, if a rendering for a 60 inch width dimension exists, but the user requires a 48½ inch width, the system may pass the parameter to the Unity (or another rendering) platform and force the live rendering of the installation.

In some embodiments, the system may render an entire room scene including background and project installation, or it may render just the installation (such as a door to allow presenting in AR. For example, on a mobile device or tablet, the image may be an overlay for the camera app to allow real-time AR. For a desktop computing device, the user may be prompted to upload the image of the environment, and the system may perform product rendering as an overlay.

Optionally, before causing the display device to display the image of the installation, it may determine a type of device and/or image viewing application that includes the display device (step 313). The system may do this by receiving an identification code from the device or its image presentation application (such as a browser), looking up the code in a data store that correlates codes to device types, and device types to imaging capabilities, and present the image in a format that corresponds to the imaging capability that corresponds to the code. Optionally, if multiple capabilities are available, the system may cause the display device to present a prompt via which the viewer may select one of the available image formats (such as augmented reality, virtual reality, and/or up to 360 degree imaging. The system may render the image of the installation in the selected or determined image format and use that format when causing the display device to display the augmented digital image.

In some embodiments, the user input device may include a prompt to enable a user to enter an indication that a facet of the design installation is not straight. (Refer to FIG. 4 for an example 403 of this.) If so, then in response to receiving such an indication the system may determine that a width associated with that facet is has a null value. Then, when displaying that facet, it may not display the non-straight facet. Alternatively, the system may ask the user to provide additional dimension, such as a smallest width and/or a largest width, or a collection of widths (such as three widths). The system may then select and display a facet corresponding to the smallest width, the largest width, or an intermediate value such as an average of the two dimensions. (Note: depending on the facet selected, the dimension of depth may be requested instead of and/or in addition to width.) Optionally, the system also may enable the user to specify a customized (non-standard) facet that matches the non-straight dimensions. In some scenarios, such as out of plumb scenarios that may require wall modifications to could accommodate available installations, if the system doesn't find a standard or composite set of products that can compensate for out of plumb condition, it may prompt the user to select a different initial product configuration type (e.g., a swinging door instead of a sliding door). Thus, the system may allow the design and selection of product in case the walls are out of plumb. The system may also include a flag in the design record indicating that a wall is not straight and that further measurements may be required.

Returning again to FIG. 1, when the product distributor server 105 makes the product configurator available on its website or through its mobile or AR device app, the product configuration server 101 may save data relating to product components that the user needs to construct the designed shower (or other installation), and it may save that data to a project file. At any of various points in the design project, the product configuration server 101 may permit the user to save a project to a project file, which will be stored by the product configuration server 101 and/or shared with the product distributor server 105 for storage. In this way, at a later time a user can resume a design project with the features that were designed at the time that the user saved the project. In addition, at any of various points the product configuration server 101 may share the project details with the product distributor server 105 so that the user can purchase the required components for the project from the distributor.

In some embodiments, when identifying products and options to present to a user, the system may only present those options that are available from the operator of the product distributor server. Alternatively, the system may present options that are not available from that product distributor but which are available from other distributors. If so, optionally it may first display those that are available from the first product distributor before displaying products and options that are available from other product distributors. In some embodiments, the system may provide the user with the option to select a product distributor before it uses that distributor's inventory to display available options. In some embodiments, the system may display all options that are available from the manufacturer. Then, after the user selects a configuration, it may access a distributor data store or search the distributor's online catalog to identify whether the distributor offers all components of the installation. If the distributor does not offer all of the components, the manufacturer may send a message that causes or requests the distributor to cause the distributor to update the catalog to include the missing component so that the user can obtain the product from the manufacturer via the distributor. Alternatively, the system may enable the user to order the missing component directly from the manufacturer while ordering other components from the distributor.

Also referring to FIG. 1, one or more third party hosts 121 may receive product reviews or other third party generated content that can be posted with various products. The product reviews or other third party generated content may be received by any of the other devices via the network 109. Optionally, the product configuration server 101 may scan third party sites or otherwise monitor communication in the network that includes but is not limited to product reviews for products that are available from the operator of the product configuration server 101. Then, when displaying candidate and/or selected products using the processes described above, the system may display product reviews that it has received for those products. The system may also rank potential products for presentation to the user based on the consumer generated content. For example, most popular products (e.g., those purchased the most, those with the most positive reviews and/or the highest overall reviews) may be displayed first. In addition, the system may parse the text of a review and semantically compare that text to one or more parameters of the installation to identify those products that are likely to satisfy the user's parameters. For example, if a review text contains certain reference to project conditions like non-straight walls, the system may rank that product relatively high and present it more prominently (e.g., first or near first) if the user indicated that the project had non-straight walls.

Figure 6:
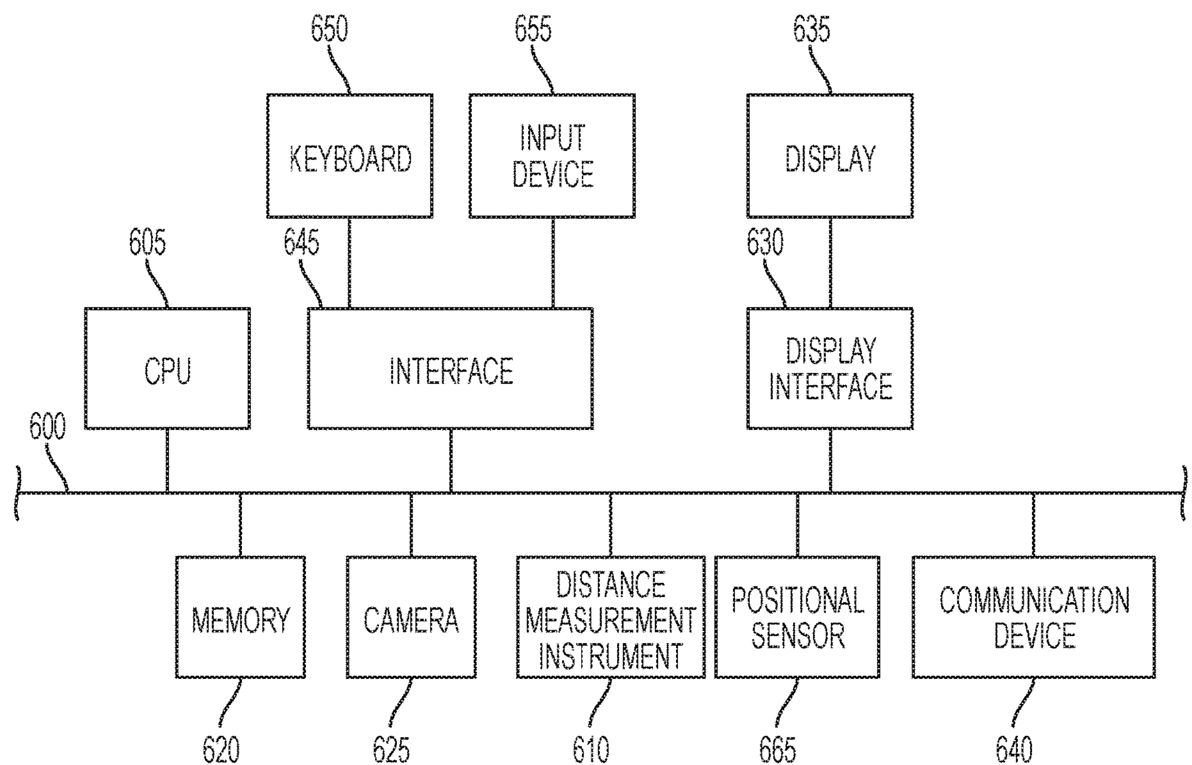
FIG. 6 is a block diagram illustrating various hardware elements that may be included in one or more electronic devices of the systems disclosed in this document.

FIG. 6 depicts an example of internal hardware that may be included in any of the electronic components of the system, an electronic device, or a remote server. An electrical bus 600 serves as an information highway interconnecting the other illustrated components of the hardware. Processor 605 is a central processing device of the system, i.e., a computer hardware processor configured to perform calculations and logic operations required to execute programming instructions. The terms "processor" and "processing device" are intended to include both single-processing device embodiments and embodiments in which multiple processing devices together or collectively perform a process. Similarly, a server may include a single processor-containing device or a collection of multiple processor-containing devices that together perform a process. A processing device may be a physical processing device, a virtual device contained within another processing device (such as a virtual machine), or a container included within a processing device.

In this document, the terms "memory," "memory device," "data store," "data storage facility" and the like each refer to a non-transitory device on which computer-readable data, programming instructions or both are stored. Read only memory (ROM), random access memory (RAM), flash memory, hard drives and other devices capable of storing electronic data constitute examples of memory devices 620. Except where specifically stated otherwise, in this document the terms "memory," "memory device," "data store," "data storage facility" and the like are intended to include single device embodiments, embodiments in which multiple memory devices together or collectively store a set of data or instructions, as well as individual sectors within such devices.

An optional display interface 630 may permit information to be displayed on a display device 635 in visual, graphic or alphanumeric format. An audio interface and audio output (such as a speaker) also may be provided. Communication with external devices may occur using various communication devices 640 such as a transmitter and/or receiver, antenna, an RFID tag and/or short-range or near-field communication circuitry. A communication device 640 may be attached to a communications network, such as the Internet, a local area network or a cellular telephone data network.

The hardware may also include a user interface sensor 645 that allows for receipt of data from input devices such as a keyboard 650, a mouse, a joystick, a touchscreen, a remote control, a pointing device, and/or an audio input device 655. Data also may be received from a camera 625. A positional sensor 665 may be included to detect position and movement of the device. Examples of positional sensors 665 include a global positioning system (GPS) sensor device that receives positional data from the external GPS network, a gyroscope, an accelerometer or an inertial measurement unit (IMU). In some embodiments, the camera data may be used as a positional sensor using technologies available in now or hereafter known augmented reality computing platforms. Also, as noted above the system may include or be communicatively connected to one or more distance measurement instruments 610 such as a laser distance measurement device.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. A system for automatically configuring and designing a home improvement installation, the system comprising:
- a product configuration server comprising a processor;
- a computer-readable memory containing programming instructions that are configured to cause a user electronic device to output a user interface on a display device in which the user interface has a first sector for displaying a product configuration engine that comprises a graphic representation of a home improvement installation, wherein the home improvement installation comprises a product that has a plurality of facets and that is to be installed in a room of a home;
- a data store of dimension data for product design models and for facets of the products for the home improvement installation, in which each of the facets in the inventory has associated measurements; and
- additional programming instructions that are configured to cause the product configuration server to implement a home improvement project configuration process comprising:
  - receiving, from a user electronic device, a product design type for an installation;
  - identifying a number of facets for the product design type,
  - receiving, from the user electronic device, dimension values for the installation,
  - extracting, from the data store, a design model that corresponds to the product design type and the number of facets,
  - causing the first sector of the display device to output a graphic representation of the extracted design model,
  - causing the first sector of the display device to augment the graphic representation of the extracted design model with indicia of the received dimension values,
  - identifying, from the data store, a facet that is operable with the extracted design model and that has associated measurements which correspond to the dimension values, and
  - causing the display device to display an image of the identified facet for further selection by a user via the user electronic device.

2. The system of claim 1, wherein the programming instructions that are configured to cause the product configuration server to identify the facet that is operable with the product design model also comprise instructions to:
- receive, via the user electronic device, one or more other attributes of the installation; and
- when identifying the facet that is operable with the product design model, only identifying a facet that has the one or more received attributes.

3. The system of claim 1, wherein the programming instructions that are configured to cause the product configuration server to implement the home improvement project configuration process also comprise instructions to, before causing the display device to display each identified facet:
- determine whether the number of facets exceeds a threshold; and
- if the number of facets exceeds the threshold, then:
  - cause the display device to output at least one user-selectable additional prompt that solicits information relating to a characteristic of a facet,
  - receive one or more characteristics via the user electronic device in response to the prompt,
  - when identifying the facet that is operable with the product design model, only identifying a facet that has the one or more received characteristics.

4. The system of claim 1, further comprising additional programming instructions that are configured to cause the product configuration server to:
- receive a user selection of one of the facets that are displayed on the display device;
- receive a user-provided digital image of the room in which the installation will occur;
- augment the user-provided digital image to insert an image of the user-selected facet in the room; and
- cause the display device to display the augmented digital image.

5. The system of claim 1, wherein the programming instructions that are configured to cause the product configuration server to implement the home improvement project configuration process also comprise instructions to:
- receive, via the user electronic device, an indication that a facet of the installation is not straight; and
- in response to receiving the indication that a facet of the installation is not straight determine that a width associated with that facet is a null value.

6. The system of claim 1, wherein the programming instructions that are configured to cause the product configuration server to implement the home improvement project configuration process also comprise instructions to:
- if no facet in the data store is operable with the extracted product design model and has associated measurements that match to the dimension values, then:
  - identify an alternative facet that is operable with the extracted product design model and that has associated measurements that are smaller than at least some of the dimension values,
  - identify a custom panel that, when attached to the identified alternative facet, will result in a composite facet having associated measurements that match the dimension values, and
  - when causing the display device to display the image of the identified facet, cause the display device to display the composite facet.

7. The system of claim 6, wherein the programming instructions that are configured to cause the product configuration server to implement the home improvement project configuration process also comprise instructions to:
- determine a value and a delivery time estimate for the composite facet;
- determine a value and a delivery time estimate for a fully-custom facet that is operable with the extracted product design model and that will have associated measurements that match the dimension values; and
- cause the display device to display the determined values and delivery time estimates for each of the composite facet and the fully-custom facet.

8. The system of claim 1, wherein the programming instructions that are configured to cause the user electronic device to output the user interface comprise instructions to do so in response to a call from a script that is running on the user electronic device when an application of the user electronic device accesses a product distributor application that includes the script.

9. The system of claim 1, further comprising:

an optical distance measuring device configured to measure dimensional data of one or more surfaces; and wherein the programming instructions that are configured to cause the product configuration server to implement the home improvement project configuration process also comprise instructions to receive the dimension values from the optical distance measuring device.

10. The system of claim 1, further comprising additional programming instructions that are configured to cause the product configuration server to:

identify a device or application type for the display device;

access a data store and identify an image delivery format that corresponds to the device or application type; and when causing the display device to display the image of the identified facet, cause the image to be displayed in the identified image delivery format.

11. A method of automatically configuring and designing a home improvement installation, the method comprising:

by a processing device:

causing a user electronic device to output a user interface on a display device of a user electronic device in which the user interface has a first sector for displaying a product configuration engine that comprises a graphic representation of a home improvement installation, wherein the home improvement installation comprises a product that has a plurality of facets and that is to be installed in a room of a home, receiving a product design type for the home improvement installation, identifying a number of facets for the home improvement installation, receiving, via the user electronic device, dimension values for the home improvement installation, accessing a data store of dimension data for product design models and for facets for the home improvement installation, in which each of the facets has associated height and width measurements, extracting, from the data store, at least one product design model that corresponds to the installation design type and the number of facets, causing the first sector of the display device to output a graphic representation of the extracted design model, causing the first sector of the display device to augment the graphic representation of the extracted design model with indicia of the received dimension values, identifying, from the data store, a facet that is operable with the extracted design model and that has associated measurements which correspond to the dimension values, and causing the display device to display an image of the identified facet for further selection by a user via the user electronic device.

12. The method of claim 11 further comprising, by the processing device:

receiving one or more other attributes of the home improvement installation; and when identifying the facet that is operable with the product design model, only identifying a facet that has the one or more received attributes.

13. The method of claim 11 further comprising, by the processing device before causing the display device to display each identified facet:

determining whether the number of facets exceeds a threshold; and if the number of facets exceeds the threshold, then:

causing the display device to output at least one user-selectable additional prompt that solicits information relating to a characteristic of a facet, receiving one or more characteristics via the user electronic device in response to the prompt, when identifying the facet that is operable with the product design model, only identifying a facet that has the one or more received characteristics.

14. The method of claim 11 further comprising, by the processing device:

receiving a user selection of one of the facets that are displayed on the display device;

receiving a user-provided digital image of the room in which the installation will occur;

augmenting the user-provided digital image to insert an image of the user-selected facet in the room; and causing the display device to display the augmented digital image.

15. The method of claim 11 further comprising, by the processing device:

receiving, via the user electronic device, an indication that a facet of the installation is not straight; and in response to receiving the indication that a facet of the installation is not straight, determining that a width associated with that facet is a null value.

16. The method of claim 11 further comprising, by the processing device:

determining that no facet in the data store is operable with the extracted design model and has associated measurements that match to the dimension values;

identifying an alternative facet that is operable with the extracted product design model and that has associated measurements that are smaller than at least some of the dimension values;

identifying a custom panel that, when attached to the identified alternative facet, will result in a composite facet having associated measurements that match the dimension values, and when causing the display device to display the image of each identified facet, causing the display device to display the composite facet.

17. The method of claim 16 further comprising, by the processing device:

determining a value and a delivery time estimate for the composite facet;

determining a value and a delivery time estimate for a fully-custom facet that is operable with the extracted product design model and that will have associated measurements that match the dimension values; and causing the display device to display the determined values and delivery time estimates for each of the composite facet and the fully-custom facet.

18. The method of claim 11, wherein the step of causing the user electronic device to output the user interface comprises doing so in response to a call from a script that is running on the user electronic device when an application of the user electronic device accesses a product distributor application that includes the script.

19. The method of claim 11, further comprising:

by an optical distance measuring device configured to measure dimensional data of one or more surfaces, capturing the dimension values; and by the processing device, receiving the dimension values from the optical distance measuring device.

20. The method of claim 11 further comprising, by the processing device:

identifying a device or application type for the display device;

accessing a data store and identifying an image delivery format that corresponds to the device or application type; and when causing the display device to display the image of the identified facet, causing the image to be displayed in the identified image delivery format.

* * * * *